United States Patent [19]

Kim et al.

[11] Patent Number: 5,413,898
[45] Date of Patent: May 9, 1995

[54] METHOD OF FORMING A PATTERN ON A SUBSTRATE HAVING A STEP CHANGE IN HEIGHT

[75] Inventors: Hak Kim, Seoul; Woo-sung Han, Suwon, both of Rep. of Korea

[73] Assignee: Samsung Electronics Co., Ltd., Suwon, Rep. of Korea

[21] Appl. No.: 164,885

[22] Filed: Dec. 10, 1993

[30] Foreign Application Priority Data

Dec. 10, 1992 [KR] Rep. of Korea .................. 92-23805
Mar. 4, 1993 [KR] Rep. of Korea ..................... 93-3210

[51] Int. Cl.⁶ ............................................. G03C 5/00
[52] U.S. Cl. .................................. 430/325; 430/394; 430/22
[58] Field of Search .................. 430/325, 394, 5, 396, 430/22

[56] References Cited

U.S. PATENT DOCUMENTS

| | | | |
|---|---|---|---|
| 4,517,280 | 5/1985 | Okamoto et al. | 430/321 |
| 4,847,183 | 7/1989 | Kruger | 430/326 |
| 5,134,058 | 7/1992 | Han | 430/394 |
| 5,279,924 | 1/1994 | Sakai et al. | 430/321 |

*Primary Examiner*—Marion E. McCamish
*Assistant Examiner*—Laura S. Weiner
*Attorney, Agent, or Firm*—Charles R. Donohoe; Robert A. Westerlund, Jr.; Stephen R. Whitt

[57] ABSTRACT

A method for forming a pattern improves a profile of a resist pattern. The method forms a photoresist layer on a substrate having a step, and exposes the photoresist layer using a first mask. Then, thick portions of the photoresist layer are exposed using a second mask, and the entire resist is developed. The second mask provides an additional increment of energy to thick regions so that no inadequately exposed resist material will remain near the step.

20 Claims, 7 Drawing Sheets

METHOD OF FORMING A PATTERN ON A SUBSTRATE HAVING A STEP CHANGE IN HEIGHT

BACKGROUND OF THE INVENTION

The present invention relates to a method for forming a pattern, and more particularly, to a method for forming a pattern having a simple manufacturing process while providing an improved profile at the portion of a high step.

Increased integration and performance demands have caused complicated structures to be introduced in semiconductor devices. Accordingly, a method for forming a fine pattern on a semiconductor substrate is required. It is widely known that patterns may be formed by a photolithographic method.

The photolithographic pattern-forming method is as follows. First, a photoresist layer whose solubility may be changed by irradiation with light, such as ultraviolet or X-ray, is formed on the upper surface of a substrate. For example, the upper surface may be an insulation layer, a conductive layer or a semiconductor wafer on which a pattern may be formed. Light is selectively irradiated onto the resist layer using a mask which exposes the resist in a predetermined pattern. Thereafter, a resist portion having a high solubility is removed, while a resist portion having low solubility is left to form a resist pattern. In the case of a positive resist, a developing step removes the exposed portion. The portion of the substrate from which the resist is removed is etched or otherwise processed to form a pattern. After completing substrate processing, the remaining resist is removed.

Although a pattern can be formed, the resolution of photolithography is limited. That is, after exposing the photoresist layer to light and developing the exposed photoresist, the line width of the formed pattern is required to have the same resolution as the line width of a photomask pattern. However, it is very difficult to maintain a constant linewidth of the pattern. Such linewidth deviations are due to energy dosage differences in resists having different thicknesses, and due to light scattering resulting from refraction and reflection (see "Silicon Processing for the VSLI Era" by S. Wolf and R.N. Tauber, Vol. 1, p.439, 1986).

FIG. 1 is a flowchart diagram of a pattern formation process according to the conventional single-layer resist method. The photosensitive material is spin-coated on the upper surface of the substrate while the substrate rotates at a velocity of 100 to 1,000 rpm. Thereafter, if the substrate is rotated at a higher speed (e.g., 2,000 to 6,000 rpm), centrifugal force spreads the photosensitive material and forms as a resist layer over the whole substrate.

FIGS. 3A and 3B illustrate shortcomings of spin coating a resist. FIG. 3A shows a cross sectional view of a substrate 1 coated with a resist material 2 in a region where the substrate has a step change in height. Although the resist thickness may be fairly uniform at locations away from the step, the resist thickness varies in a region A in the vicinity of the step.

FIG. 3B shows a surface view of a substrate with resist after developing. The resist has been patterned and developed to form lines which cross the step region. In locations away from the step, the resist development process leaves lines of resist 3a and lines of exposed substrate 3b. However, in the vicinity of the step, in lines which should have exposed substrate, some resist material 4 remains.

This undesirable result can occur because the resist is thicker in the vicinity of the step, and the resist material is not uniformly exposed. Typically, optical equipment used to expose the resist material focuses the pattern at a focal plane. The focal plane is adjusted to lie between the surface of the resist material and the substrate. However changes in substrate height makes it difficult to align the focal plane precisely with the center of the resist layer. Because of the increased resist thickness in the vicinity of the step and alignment of the focal plane, material close to the substrate may not be fully exposed. For example, the pattern may be out-of-focus at the bottom of the step, and diffusion of the light energy over a greater amount of material may result in insufficient exposure. The result may be undesirable variations in line thickness, bridging, scum, etc.

To solve the above problem of the conventional single-layer resist (SLR) method described above, a multilayer resist (MLR) method has been developed.

FIG. 2 shows a flowchart according to the MLR method and FIG. 4 shows an interlayer structure during pattern formation according to the MLR method.

First, on the upper portion of substrate 1, a lower photoresist 11 is applied to form a planarized surface and then baked. After an insulation layer 12 is coated on the upper portion of the lower photoresist 11, an upper photoresist 13 is coated to form a multi-layer resist. After the upper photoresist is exposed and developed, the insulation layer 12 is dry-etched and the lower photoresist 11 is etched using oxygen gas ($O_2$) plasma to form a resist pattern. Then, using the resist pattern, the substrate is etched (or otherwise processed), and the remaining resist is removed. The MLR method can yield patterns having resolution less than or equal to 0.5 $\mu$m.

One application of the MLR method is disclosed in Japanese Laid-open Patent Publication sho 51-107775. In the above Japanese publication, an organic layer (lower layer) is thickly coated onto a substrate in which uneven portions or steps exist so as to planarize the upper portion of the substrate. An intermediate layer composed of a spin on glass (SOG), a phosphosilicate glass (PSG) or $SiO_2$ is formed, and then a photoresist layer (upper layer) is formed on the intermediate layer. The upper layer is exposed and developed according to the conventional photolithographic techniques, and the intermediate layer is etched. Then, using the intermediate layer as a mask, the portion of the thick layer (exposed through the intermediate layer) is dry-etched. The exposed portion of the substrate is dry-etched to form a predetermined pattern.

Also, Korean Patent Publication No. 89-3903 discloses a method for improving a resolution of a pattern in the MLR method. By reducing differences between the refractive indices of the intermediate layer with respect to the upper and lower layers, light reflection is reduced at the layer boundaries. At the same time, interference which occurs due to the difference in layer thickness is prevented, which in turn reduces pattern variations.

The method described in the above-mentioned Korean patent publication comprises the steps of: 1) sequentially depositing a lower layer of organic polymer, an intermediate layer made of a material having a larger resistance to dry-etching than the lower layer and a photosensitive upper layer; 2) exposing the upper layer with a pattern and developing the exposed portion; 3) removing an exposed portion of the lower layer; 4) and forming a substrate pattern using the lower layer as a mask. The differences between the refractive indices of the intermediate layer relative to the upper and lower layers are less than or equal to 12%.

The fine pattern having a high resolution can be obtained by the MLR method. However, since the processes are complicated productivity is low, the number of defective products increases and the entire cost of the semiconductor manufacturing process increases.

SUMMARY OF THE INVENTION

An object of the present invention is to provide an improved method of forming patterns in a photoresist material.

Another object of the present invention is to provide a method of forming patterns over a substrate having a step in height.

Still another object is to provide a method of forming patterns with improved productivity and reduced cost.

A further object of the present invention is to provide a method for completely exposing a single-layer resist having an uneven thickness.

An additional object of the present invention is to provide a method of forming patterns in a resist with reduced defects, such as bridging and scum, between adjacent pattern lines.

These and other objects are achieved by forming patterns in a single-layer resist using two masks and two exposure steps. A first exposure step proceeds in a usual way to expose a resist material with a desired pattern to be formed. A second exposure step uses a second mask to provide a relatively wide-area exposure over regions where the resist material is especially thick, such as regions where the underlying substrate has a step in height. The second exposure uses a lower exposure energy than the first, so that the marginal dose will complete exposure of regions already partially exposed, but will not significantly change regions that are not already exposed.

The method may be further improved by changing the focus of the exposure apparatus for the second mask. The method may be improved even further by using a grate pattern or a checkerboard type pattern in the second mask. The method may be improved further still by changing the focus of the second mask and using a grate or checkerboard type pattern, especially when the pitch of the grating is small compared to the change in resolution caused by changing the focus.

The present invention provides a pattern formation method capable of obtaining a pattern having an excellent resolution. Since a single-layer resist method is used, the complicated processes of a multi-layer resist method are avoided, thereby simplifying the processes, saving cost, and easily developing photoresist at step portions.

BRIEF DESCRIPTION OF THE DRAWINGS

The above object and other advantages of the present invention will become more apparent by describing in detail a preferred embodiment of the present invention with reference to the attached drawings in which.

DETAILED DESCRIPTION OF THE INVENTION

In a preferred embodiment of the present invention, a resist material is exposed a first time using a first mask, and then thicker resist portions are exposed a second time using a second mask. It is particularly desirable that the resist layer is sequentially exposed in one exposure apparatus using a first mask and then a second mask. It is also desirable that the second mask pattern is manufactured so as to have a resolution of 0.5 $\mu$m to 400 $\mu$m along a step portion. The resolution of the second mask pattern may be adjusted according to the thickness of the photoresist and the depth of the step. For example, if problems are encountered in certain discrete areas on the substrate the second mask may be adjusted according to the sizes and thicknesses of the problem areas.

Figure 5:
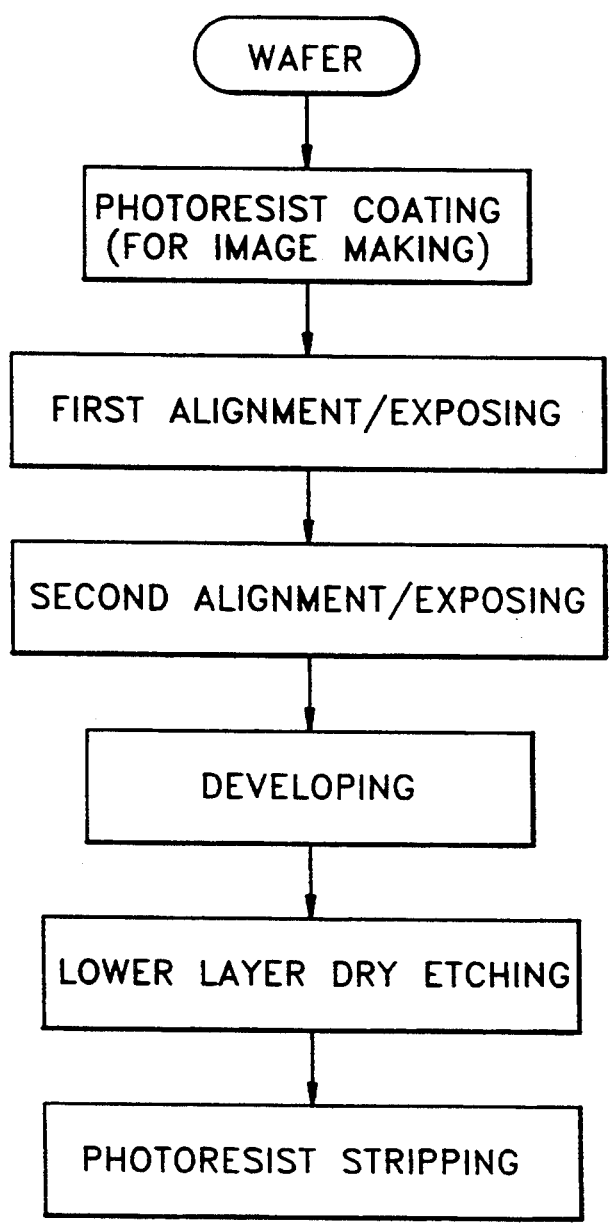
FIG. 5 is a flowchart of a pattern formation process according to the present invention.

FIG. 5 is a flowchart of a pattern formation process according to the present invention. To form a pattern having a high resolution in a device having a step, a single-layer resist is exposed a first time using a mask having a predetermined pattern. Then, to ensure removal of the thick resist at the step portion, a second exposure is performed using a second mask having a second predetermined pattern. The decomposition density of the photo active compound (PAC) of the resist is small due to a weak exposure energy dosage at the thick resist portion after the first exposure. The step portion is once more exposed, thereby supplementing the exposure energy dosage to increase the decomposition density of the PAC.

It is desirable that the energy dosage of the second exposure is 5% to 20% that of the first exposure. If the energy dosage is less than 5%, the marginal exposure effect is weak. If the energy dosage is more than 20%, the resolution of the pattern is reduced.

Of course, some regions of the resist will receive no exposure during the first exposure (because they should remain after developing). Some of these portions may nevertheless receive some energy during the second exposure. If the second exposure energy dosage is weaker than the first exposure energy dosage, then the second exposure will have no significant effect, and these regions will remain after developing. The resist is sufficiently exposed at the step portion, which is twice exposed, and a clean pattern is formed in edge portions.

The second mask may be drawn to match the locations of the step with fewer fine patterns than the first mask. Since the second mask may have a relatively coarse resolution, the second exposure does not require as exact an alignment as in the first exposure. Also, there are no problems with rotation, orthogonality, etc., of the mask. Thus, the second exposure process is relatively simple, but provides excellent results.

To further improve the pattern, the second exposure may be "defocused" by several micrometers. Such a defocus improves transition of the pattern at the edge where the first mask overlaps with the second mask. Preferably, the defocus is 0.5 to 20 μm.

Also, a grating pattern (X- or Y- direction) or a checkered pattern may be added to the second mask.

Figure 6A:
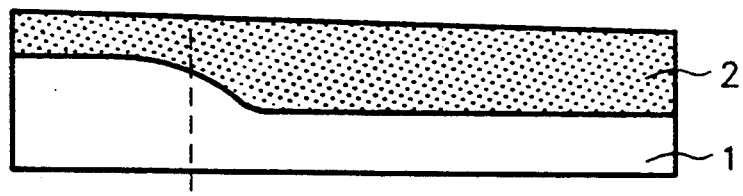
FIG. 6A is a cross-sectional view of a photoresist layer having a step.
Figure 6B:
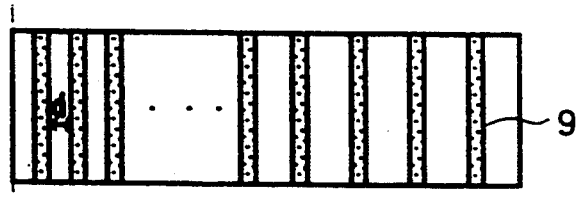
FIGS. 6B and 6C show layouts of arranging grating patterns which are designed on a second mask used in the present invention on the upper portion of the photoresist layer of FIG. 6A.
Figure 6C:
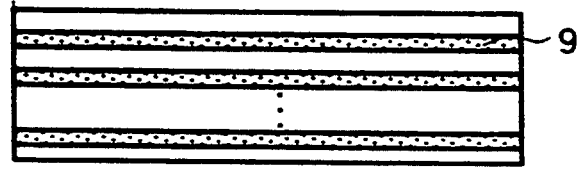
Figure 6D:
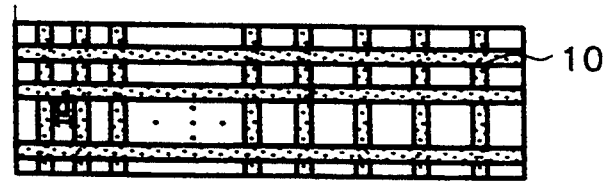
FIG. 6D shows a layout of arranging a checkered pattern which is designed on a second mask used in the present invention on the upper portion of the photoresist layer of FIG. 6A.

FIG. 6A shows a cross-section of a resist pattern at a step, and FIGS. 6B through 6D show grating patterns (reference numeral 9 in FIGS. 6B and 6C) and a checkered pattern (reference numeral 10 in FIG. 6D) for the second mask.

In such a pattern, the gratings are inserted parallel to the step and the distance "d" between gratings is adjusted and arranged according to the change of the thickness of the photoresist by the step. Accordingly, the variation of the pattern size according to the change of the thickness of the photoresist can be minimized. Here, the size or the distance of the grating pattern or the checkered pattern is made to be equal to or less than the resolution critical peripheral area. It is desirable that the second pattern is designed as a pattern which is not represented by the defocus. The grating pattern or the checkered pattern can be varied in the size or the distance thereof according to the change of the thickness of the photoresist.

Masks are generally classified as hard masks or soft masks. However, the soft mask has difficulty forming a pattern less than or equal to 2.5 m. The hard mask is preferred and manufactured by coating a thin layer of photointerceptive material on the substrate by means of deposition, sputtering or chemical vapor deposition. Sodalime, borosilicate, crystal, etc., can be used as the material of the mask substrate. Among them, the price of crystal is particularly high. However, crystal has merits in that the thermal expansion coefficient is extremely small and the transmission rate of ultraviolet light is very high. Thus, it is desirable that the crystal is used as the material of the mask substrate.

Silicon, ferric oxide, chrome or oxides of chrome can be used as a photointerceptive layer material which is coated on the mask. Besides the conventional mask in which chrome/chromic oxide is coated on the substrate, a reflective mask or a phase mask, etc., can be used as a mask which can be used in the present invention.

The exposure light which can be used in the present invention has no limitations. A KrF Excimer laser (248 nm) h-line (405 nm) and broadband deep ultraviolet light (240–440 nm) coming from a mercury lamp or a Xe lamp, can be used.

Exposure method is not critical, and may be a reduced projection exposure method, one-to-one projection exposure method, X-ray exposure method, etc.

The photosensitive material is generally classified into a positive type or a negative type. The negative type photosensitive material is composed of a mixture of cyclized rubber-based resin and bisazide-based compound. The light irradiated portion is hardened by forming a network structure by means of a crosslinked material (bisazide-based compound), and the non-exposed portion is dissolved out by a developer. On the other hand, the positive type photosensitive material is generally composed of a quinone diazide-based photosensitive material, an alkaline-soluable phenol-based resin and an organic solvent. The resin is itself alkaline-insoluble, and becomes alkaline-soluble after light irradiation. Since the positive type photosensitive material has higher resolution than the negative type, the positive type is preferred. However, either the positive type or the negative type can be used. For example, a novolak-based resist composition, chemically amplified resist composition or chain scission resist composition can be used as the positive type photosensitive material.

Hereinbelow, a preferred embodiment of the present invention will be specifically described. However, the present invention is not limited thereto.

EXAMPLE 1

By spin-coating the photoresist including novolak-based resin and diazonaphthoquinon on the upper portion of the substrate having a step, the photoresist layer is formed with a thickness of about 1.2 μm. Alignment-exposure using a predetermined crystal mask having a metal pattern is performed with the ultraviolet g-line (436 nm). Thereafter, the first mask is replaced by a second mask having a pattern of 9 to 10 μm or so aligned in the same direction as that of the metal pattern. Then, the already-exposed resist is exposed a second time with an energy of 10% or so of the first exposure energy. Here, the focal point of the second mask is made to move by about 5 μm so as to defocus the pattern. Thereafter, wet development is performed with an aqueous alkaline solution of tetramethyl ammoniumhydroxide (TMAH) to form a resist pattern. Using the formed resist pattern, the underlying substrate is etched, and the remaining resist is removed.

EXAMPLE 2

The photoresist layer is formed on the upper portion of the substrate having a step, by the same method as described in example 1. Alignment-exposure using a predetermined crystal mask having a metal pattern is performed with the ultraviolet g-line (436 nm). Thereafter, the first mask is replaced by a second mask having a pattern size of 9 to 10 μm or so aligned in the same direction as that of the metal pattern. The second mask also has a grating pattern or a checkered pattern having a spacing of 0.1 to 0.2 μm. Then, the already exposed resist is exposed a second time with an energy of 10% or so of the first exposure. Here, the focal point of the second mask is moved by about 5 ‖ m as a defocus. Thereafter, wet development is performed with an aqueous alkaline solution of tetramethyl ammoniumhydroxide (TMAH) to form a resist pattern. Using the formed resist pattern, the underlying substrate is etched, and the remaining resist is removed.

In the above embodiments, roughness of the pattern at the edge portion (where the first and second mask areas overlap) can be improved by the defocus, and the effect of the grating pattern or the checkered pattern can be improved.

Figure 7A:
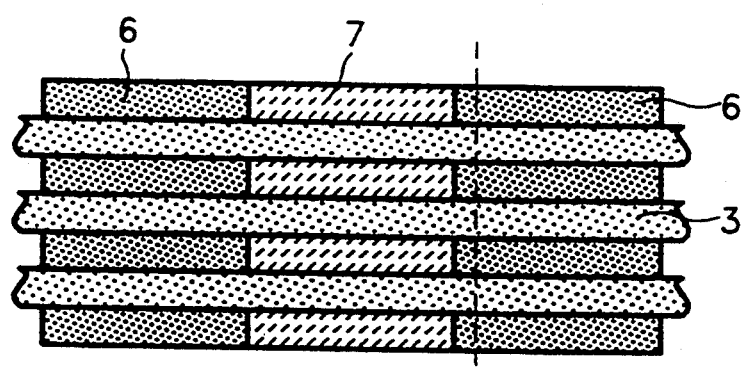
FIGS. 7A through 7C show a procedure of the pattern formation according to the process flow in the pattern formation method according to the present invention.
Figure 7B:
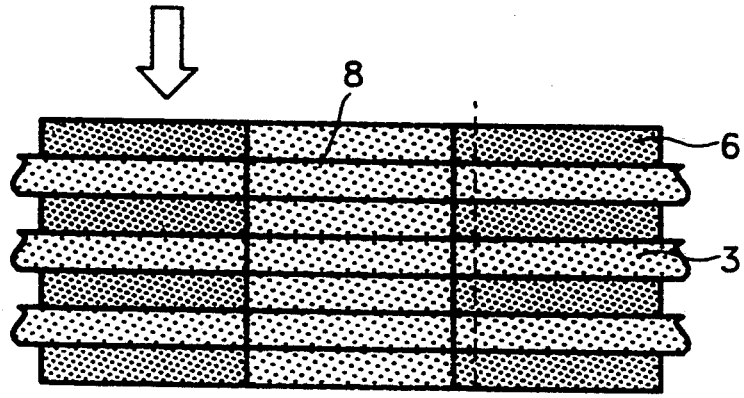
Figure 7C:
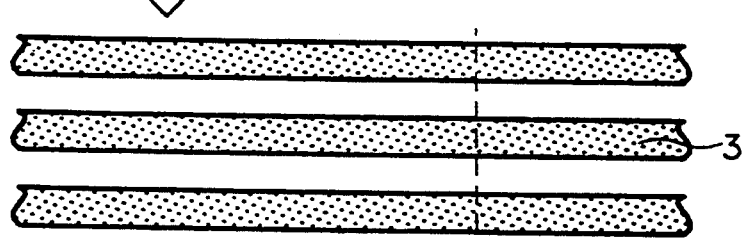
Figure 8A:
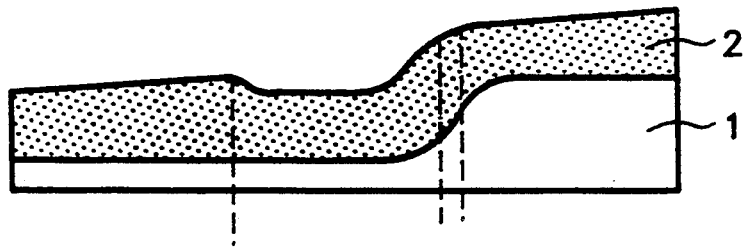
FIGS. 8A and 8B show a cross-section of the resist at the step during a pattern formation according to the conventional single layer resist method, and a shape of the pattern at the step after developing, respectively.
Figure 8B:
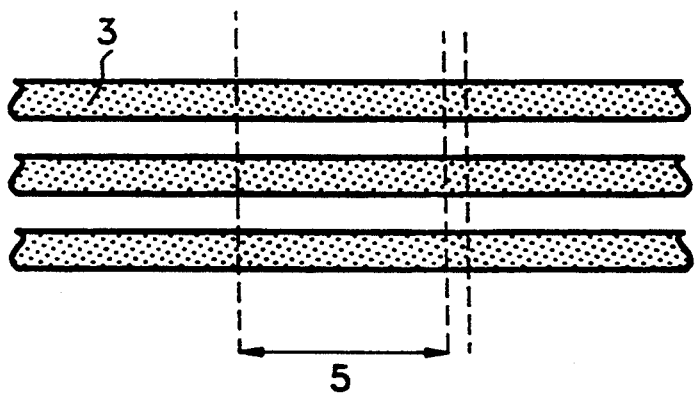

FIGS. 7A through 7C show the process flow for pattern formation according to the present invention. FIGS. 8A and 8B show shapes of the patterns at the step, which may be obtained according to the first or second embodiment.

Figure 1:
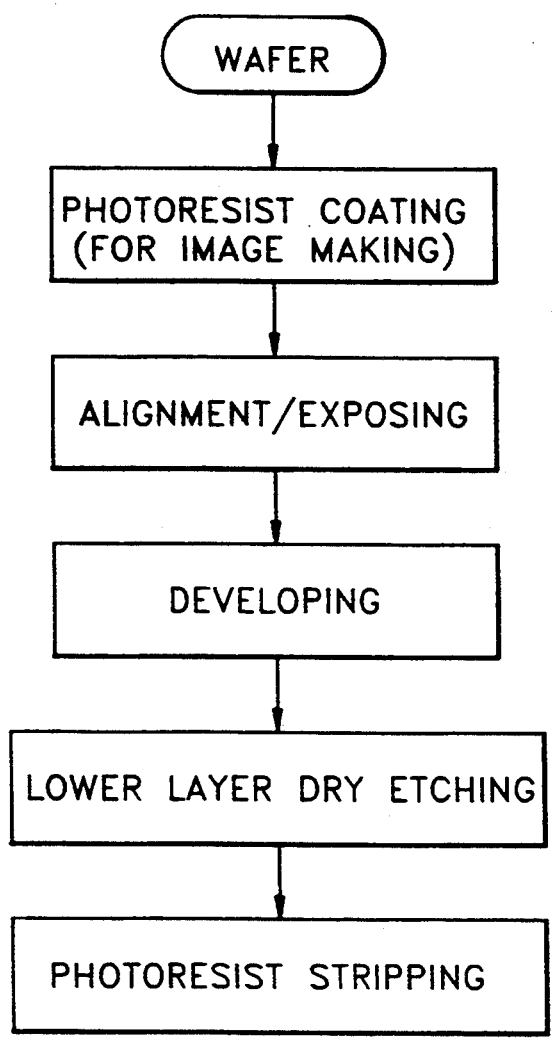
FIG. 1 is a flowchart of a pattern formation process according to a conventional single-layer resist (SLR) method.
Figure 2:
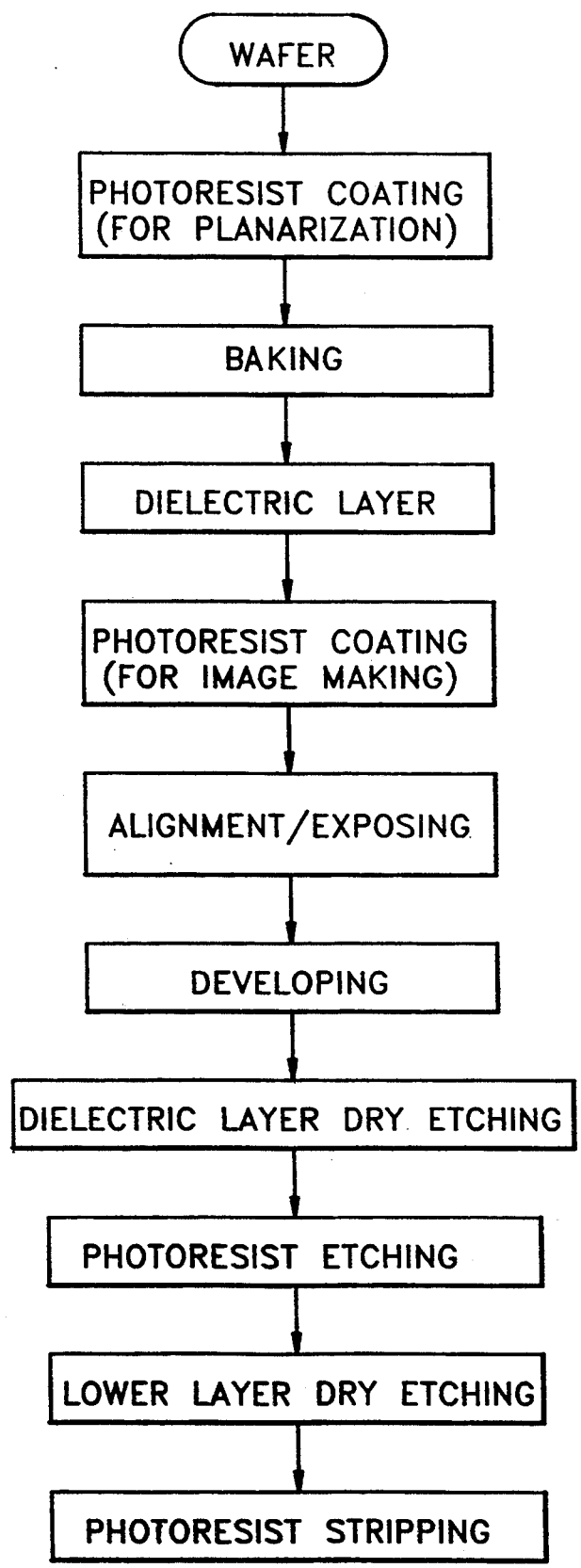
FIG. 2 is a flowchart of a pattern formation process according to a conventional multi-layer resist (MLR) method.
Figure 3A:
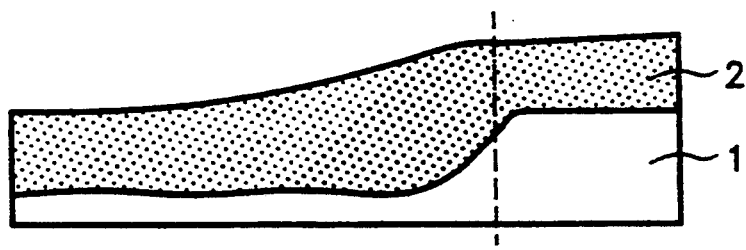
FIGS. 3A and 3B are in cross-sectional view and a top view of a change of the resist thickness at the step and a shape of the pattern at the step after developing, respectively.
Figure 3B:
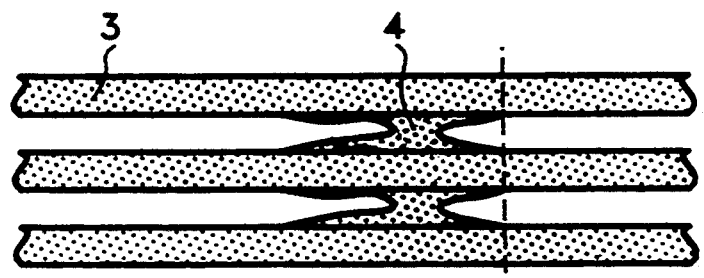
Figure 4:
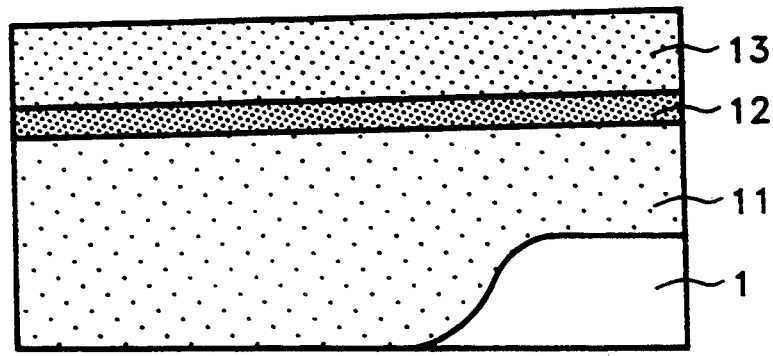
FIG. 4 is a cross-sectional view of the interlayer structure during a pattern formation according to the conventional MLR method.

FIG. 7A illustrates regions of exposed and unexposed resist. The pattern leaves unexposed regions 3C crossing a step of the underlying substrate (similar in layout to the arrangement of FIGS. 3A and 3B). Region 7 lies in the vicinity of a step where the resist layer is uneven, while regions 6A and 6B lie far enough away that the thickness of the resist layer is uniform. During a first exposure with a first mask, regions 6A and 6B receive a sufficient does to fully expose the resist material. However, the added thickness of region 7 results in an incomplete exposure.

FIG. 7B illustrates regions of exposed and unexposed resist after a second exposure using a second mask. The second mask exposes a contiguous region 8 which overlaps the step region. As to the exposed step region 7, the incremental energy of the second mask completes the exposure of the resist material. As to unexposed regions 3C, the incremental energy is not sufficient to significantly alter the resist material.

Then, by a post-exposure bake (PEB) and development, a smooth resist pattern 3 is formed without bridging or scum at the step (FIG. 7C).

FIGS. 8A and 8B illustrate a cross section and a top view of the resist pattern formed in the vicinity of a step after development. Resist material 2 has been removed in clean patterns to expose the underlying substrate 1. The second exposure may produce a slight depression in the resist material in the vicinity of the step. However, this depression is not significant, since the resist material was initially thickest in this vicinity.

As described above, resist pattern is made according to the present invention, a resist pattern having an excellent profile (comparable to the MLR method) can be obtained with a single-layer resist by performing the exposure twice using two mask patterns.

Also, according to the present invention, the defect rate is extremely small (excluding the defects of the photoresist itself), and the process is simple, thereby improving through-put and reducing cost. Thus, even though a step-change in height exists, a fine pattern can be easily formed.

While the invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a pattern on uneven surfaces comprising the steps of:
   forming a photoresist layer on a substrate having a step change in height;
   exposing said photoresist layer using a first mask;
   exposing a portion of said photoresist layer overlying said substrate step change using a second mask, said second mask having a pattern selected from one of a grating pattern and a checkerboard pattern; and
   developing said exposed portion of said photoresist layer.

2. A method according to claim 1, comprising a further step of adjusting a dimension of said pattern of said second mask according to a thickness of said photoresist layer and said height of said step.

3. A method according to claim 1, wherein said steps of exposing said photoresist layer using said first mask and said step of exposing said portion of said photoresist layer using said second mask are performed respectively sequentially in a same exposure apparatus.

4. A method according to claim 1, wherein said step of exposing said portion of said photoresist layer using said second mask includes exposing said portion of said photoresist layer using said second mask at an exposure energy which is about 5% to 20% of an exposure energy used in said step of exposing said photoresist layer with said first mask.

5. A method according to claim 1, wherein said step of exposing said portion of said photoresist layer using said second mask includes a step of providing said pattern of said second mask with a size of about 0.5 to 400 $\mu$m along said step.

6. A method according to claim 1, wherein said step of exposing said portion of said photoresist layer with said second mask is performed with a first focus different than a second focus of said exposure performed in said Step of exposing said photoresist layer with said first mask.

7. A method according to claim 6, wherein said second focus moves a focal plane from 0.5 $\mu$m to about 20 $\mu$m from a focal plane of said first focus.

8. A method according to claim 1, comprising a further step of providing said second mask pattern with a resolution proportional to a thickness of said photoresist layer.

9. A method according to claim 1, comprising a further step of providing said second mask pattern with a resolution of not more than a predetermined resolution.

10. A method according to claim 1, wherein said pattern of said second mask is provided having not more than a critical resolution by a defocus at said step of exposing a portion of said photoresist layer using said second mask.

11. A method for forming a pattern on uneven surfaces comprising the steps of:
   forming a photoresist layer on a substrate having a step change in height;
   forming a pattern in said photoresist layer by firstly exposing said photoresist layer using a first mask;
   uniformly reducing a thickness of said photoresist layer remaining after said step of forming a pattern in said photoresist layer, by secondly exposing a portion of said substrate having said step change using a second mask, said second mask having a pattern selected from one of a grating pattern and a checkerboard pattern; and
   developing said firstly and secondly exposed portions of said photoresist layer, said step of developing forming a pattern of said first mask in said photoresist.

12. A method according to claim 11, comprising a further step of adjusting a dimension of said pattern of said second mask according to a thickness of said photoresist layer and said height of said step.

13. A method according to claim 11, wherein said steps of firstly exposing and secondly exposing are performed respectively sequentially in a same exposure apparatus.

14. A method according to claim 11, wherein said step of secondly exposing said portion of said substrate exposes a portion of said photoresist layer at an exposure energy which is about 5% to 20% of an exposure energy used in said step of firstly exposing said photoresist layer.

15. A method according to claim 11, wherein said step of secondly exposing said portion of said substrate includes a step of providing said pattern of said second mask with a size of about 0.5 to 400 μm along said step.

16. A method according to claim 11, wherein said step of secondly exposing said portion of said substrate is performed with a first focus different than a second focus of said exposure performed in said step of firstly exposing said photoresist layer.

17. A method according to claim 16, wherein said second focus moves a focal plane from 0.5 μm to about 20 μm from a focal plane of said first focus.

18. A method according to claim 11, comprising a further step of providing said second mask pattern with a resolution proportional to a thickness of said photoresist layer.

19. A method according to claim 11, comprising a further step of providing said second mask pattern with a resolution of not more than a predetermined resolution.

20. A method according to claim 11, wherein said pattern of said second mask is provided having not more than a critical resolution by a defocus at said step of secondly exposing a portion of said photoresist layer.

* * * * *